(12) United States Patent
Lin

(10) Patent No.: US 11,293,956 B2
(45) Date of Patent: Apr. 5, 2022

(54) REAL-TIME POWER MONITORING METHOD, ELECTRONIC DEVICE AND COMPUTER PROGRAM PRODUCT

(71) Applicant: NANNING FUGUI PRECISION INDUSTRIAL CO., LTD., Nanning (CN)

(72) Inventor: Yung-Chieh Lin, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 37 days.

(21) Appl. No.: 16/885,984

(22) Filed: May 28, 2020

(65) Prior Publication Data

US 2021/0373053 A1 Dec. 2, 2021

(51) Int. Cl.
*G01R 19/25* (2006.01)
*G01R 19/252* (2006.01)

(52) U.S. Cl.
CPC ....... *G01R 19/2513* (2013.01); *G01R 19/252* (2013.01)

(58) Field of Classification Search
CPC .............. G01R 19/2513; G01R 19/252
USPC ........................ 324/522, 512, 500
See application file for complete search history.

(56) References Cited

U.S. PATENT DOCUMENTS

| 2020/0033435 A1* | 1/2020 | Macias ............... G01R 15/148 |
| 2020/0158808 A1* | 5/2020 | Newlin ................ G01R 19/32 |
| 2021/0270870 A1* | 9/2021 | Chen .................. H03F 3/45475 |

FOREIGN PATENT DOCUMENTS

| TW | 470878 B | 1/2002 |
| TW | 502152 B | 9/2002 |
| TW | 201428483 A | 7/2014 |
| TW | I463307 B | 12/2014 |
| TW | 201705030 A | 2/2017 |
| TW | I592827 B | 7/2017 |

\* cited by examiner

*Primary Examiner* — Giovanni Astacio-Oquendo
(74) *Attorney, Agent, or Firm* — ScienBiziP, P.C.

(57) ABSTRACT

A real-time power monitoring method executable by an electronic device, comprising: performing an ADC calibration operation to a voltage of a first battery of the electronic device; calculating and forming a diagonal line for the first battery; determining whether the comparison result between a gain and an offset and an optimum gain and an optimum offset is located with a preset error range; if the comparison result is located with the preset error range, determining that the voltage calibration for the first battery is successful; and, if the comparison result is located outside the preset error range, determining that the voltage calibration for the first battery is unsuccessful, analyzing and fixing the first battery and for re-performing the ADC calibration to the first battery.

10 Claims, 11 Drawing Sheets

REAL-TIME POWER MONITORING METHOD, ELECTRONIC DEVICE AND COMPUTER PROGRAM PRODUCT

BACKGROUND

1. Technical Field

The disclosure relates to a monitoring method for an electronic device, and more particularly to a real-time power monitoring method for an electronic device and a computer program product using the method.

2. Description of Related Art

Electronic devices on the markets are usually equipped with remote controllers for remote controls. Various applications are developed for the remote controllers according to user requirements, such as a remote controller, having Bluetooth and voice functions, applied to an over-the top (OTT) of a TV box. Further, the microcontroller of the remote controller is designed to provide low power consumption and low starting voltage.

However, the feature of the low starting voltage of the microcontroller usually results in a zinc-carbon battery being installed in the remote controller. The voltage of the zinc-carbon battery less than 0.9V may bring battery leakage and results in unrecoverable damages of an electronic device installed with the zinc-carbon battery. Thus, a protection mechanism for a low voltage battery is important. As the protection mechanism for the low voltage battery is introduced in a set-top box, the battery power is unstable caused by that the microcontroller mistakenly reads the battery voltage or reads the battery voltage at a wrong time point, which confuses the user or enables the battery to enters the low voltage protection mode earlier than a desired time point.

BRIEF DESCRIPTION OF THE DRAWINGS

Many aspects of the present disclosure can be better understood with reference to the following figures. The components in the figures are not necessarily drawn to scale, the emphasis instead being placed upon clearly illustrating the principles of the present disclosure. Moreover, in the drawings, like reference numerals designate corresponding parts throughout the several views. Implementations of the present technology will now be described, by way of embodiments, with reference to the attached figures, wherein.

DETAILED DESCRIPTION

Figure 1:
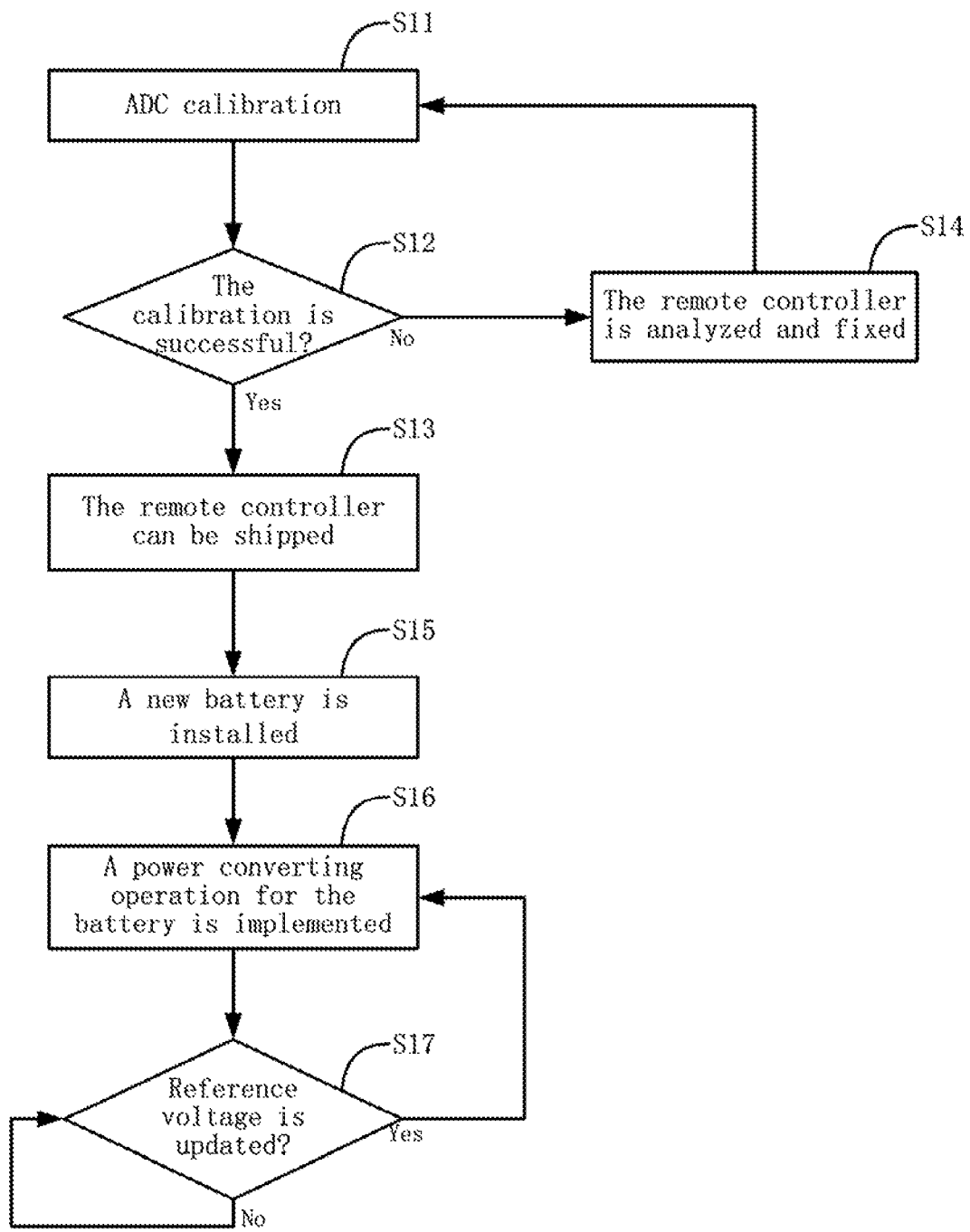
FIG. 1 is a flowchart of an embodiment of a real-time power monitoring method of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "comprising," when utilized, means "including, but not necessarily limited to"; it specifically indicates open-ended inclusion or membership in the so-described combination, group, series, and the like.

An embodiment of a real-time power monitoring method introduces an instantaneously monitoring battery algorithm (IMBA) in a microcontroller (MCU) of an electronic device having low power consumption to obtain a more accurate power value. A battery voltage is obtained by reading a current voltage value using a MCU of an analog-to digital converter (ADC). The accurate of the ADC affects correctness of the detected battery power. A high accurate voltage detection method can be gained by the ADC calibration, the power conversion and the modulated voltage detection.

FIG. 1 is a flowchart of an embodiment of a real-time power monitoring method, applied in an electronic device, of the present disclosure. The order of the steps in the flowchart can be changed and some steps can be omitted according to different requirements.

In block S11, an ADC calibration operation is performed to the battery voltage of the electronic device, for example, a remote controller.

Samples of continuous battery variations are usually taken using ADC pins of the MCU of the remote controller. However, resolutions of the MCU and tolerances of circuit components themselves may cause deviations between battery voltages read by the ADC and real battery voltages. Thus, error amplitudes must be confirmed and machines having excessive errors have to be corrected.

Figure 2:
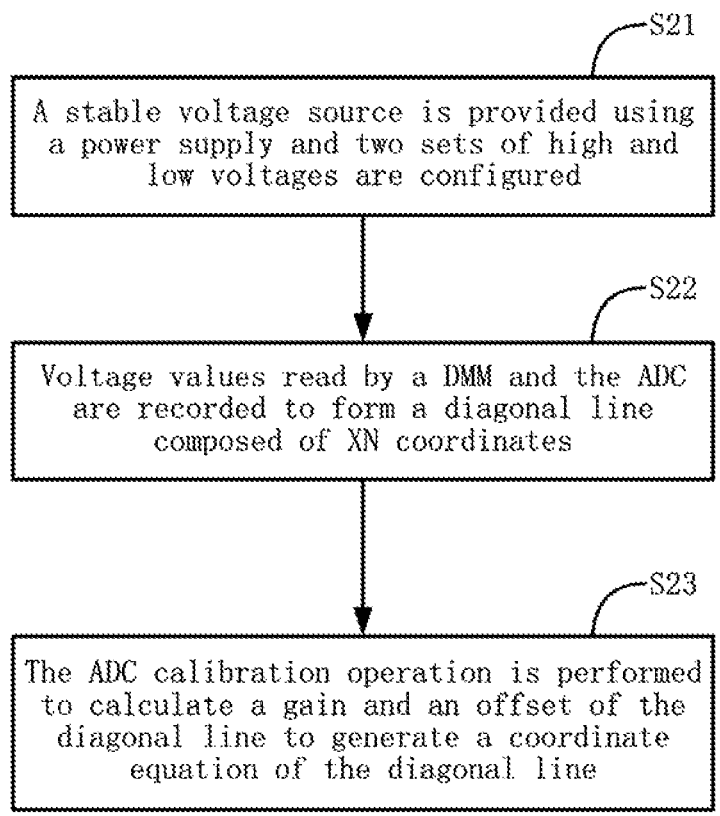
FIG. 2 is a flowchart of an embodiment of ADC calibration of the present disclosure.

FIG. 2 is a flowchart of an embodiment of ADC calibration, applied in the electronic device, of the present disclosure. The order of the steps in the flowchart can be changed and some steps can be omitted according to different requirements.

In block S21, a stable voltage source is provided to the electronic device, for example, a remote controller, using a power supply and two sets of high and low voltages are configured.

In block S22, voltage values of the remote controller read by a digital multi-meter (DMM), representing the X axis, and the ADC, representing the Y axis, are recorded to form a diagonal line composed of XY coordinates.

Figure 3A:
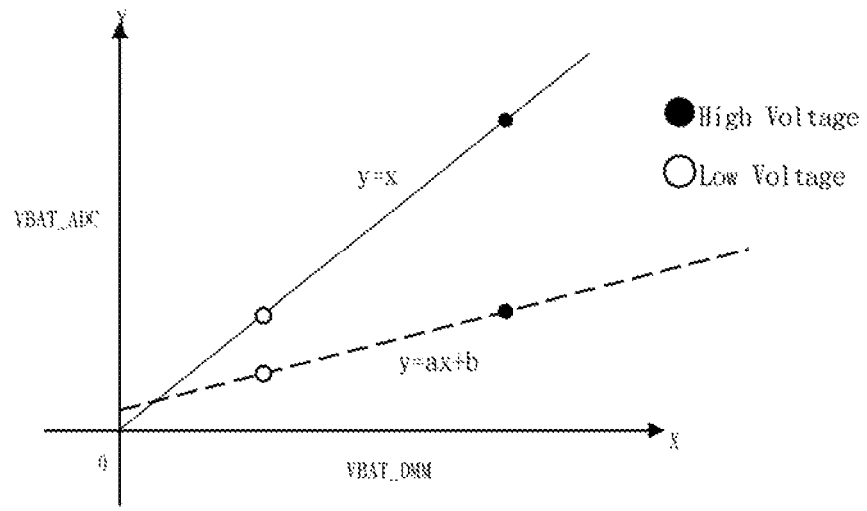
FIG. 3A is a diagram of diagonal lines of voltage values of a remote controller, read by a digital multi-meter (DMM) and an analog-to-digital converter (ADC) under an optimum state and a real state according to an embodiment of the present disclosure.

Referring to FIG. 3A, the X axis represents the accurate voltage value read by the DMM (VBAT_DMM) while the Y axis represents the voltage value read by the ADC (VBAT_ADC). The VBAT_ADC voltage value is less accurate and should be corrected. Under the optimum state, the VBAT_DMM voltage value is identical to the VBAT_ADC voltage value (y=x). Actually, the VBAT_DMM voltage value is not identical to the VBAT_ADC voltage value (y=ax+b).

In block S23, the ADC calibration operation is performed to calculate a gain and an offset of the diagonal line to generate a coordinate equation of the diagonal line and store the coordinate equation in the MCU. Therefore, the voltage value read by the ADC can be converted to a more accurate real voltage value.

Figure 3B:
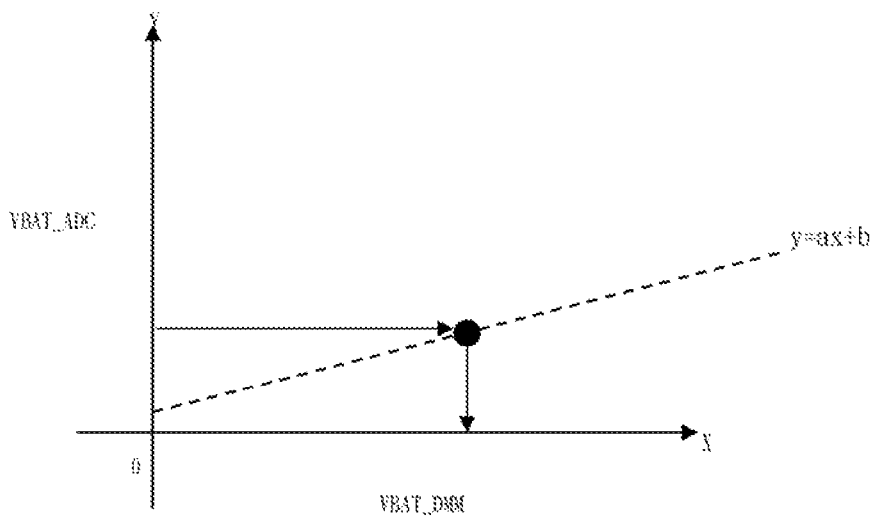
FIG. 3B is a diagram of a diagonal line of the voltage values of the remote controller, read by the DMM and the ADC under the real state according to the present disclosure.

Referring to FIG. 3B, a linear equation in two variables, y=ax+b, of the diagonal line can be obtained according to real voltage values of the diagonal line within the coordinate system, where 'a' indicates the gain and 'b' indicates the offset. The values 'a' and 'b' are substituted into the linear equation in two variables and stored in the MCU to complete the calibration. After that, whenever the voltage values are read by the ADC and substituted into the linear equation in two variables, accurate voltage values of the remote controller can thus be calculated.

Figure 3C:
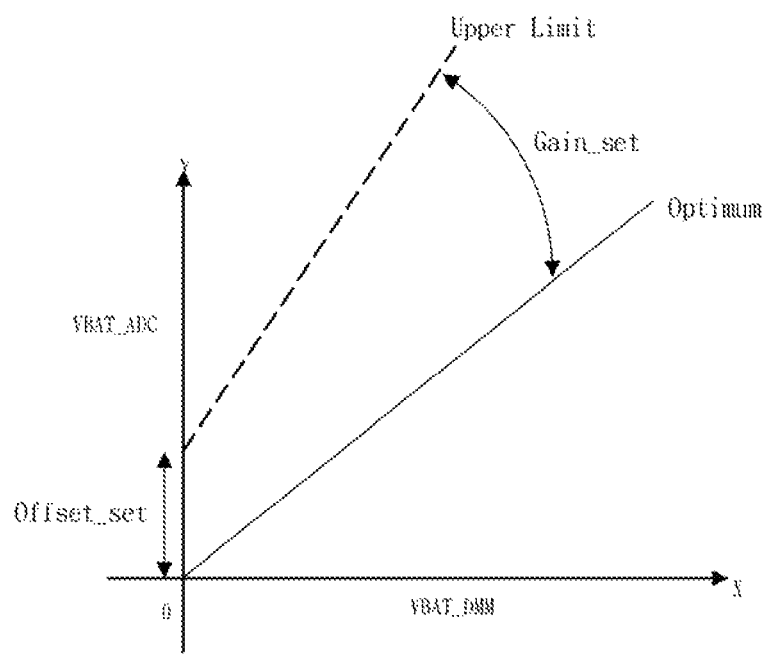
FIG. 3C is a diagram of a diagonal line of the voltage values of the remote controller, read by the DMM and the ADC under the optimum state according to the present disclosure, where an upper limit and a lower limit of a slope and an offset of the diagonal lines are defined.

Referring to FIG. 3C, upper limits and lower limits of the values 'a' and 'b', "Gain Set" and "Offset Set", can be configured to prevent that remote controllers damaged by process issues are shipped.

In block S12, it is determined whether the comparison result between the calculated gain and offset and the optimum gain, for example, 1, and offset, for example, 0, is located with a preset error range. In other words, it is determined whether the calibration of the battery voltage of the remote controller is successful.

In block S13, if the comparison result is located with the preset error range, indicating that the calibration for the battery voltage is successful, the remote controller can be shipped.

In block S14, if the comparison result is located outside the preset error range, indicating the calibration for the battery voltage is unsuccessful, the remote controller is analyzed and fixed and the process proceeds to the block S11 for repeating the ADC calibration of the remote controller.

In block S15, a new battery is installed in the remote controller.

In block S16, a power converting operation for the battery is implemented to the new battery.

An over-the-top (OTT) TV box can display information of a matched remote controller via its user interface (UI). Generally, the displayed battery data is a power percentage not a battery voltage and, therefore, the battery voltage of the new battery must be converted to be displayed by the power percentage. As known by experiments, even the remote controller is successively used by voice controls with the most power consumption, about 10 mA, the battery of the remote controller can be used for more than 53 hours, 2×AAA, 3.3V→2.2V, as shown by the discharge curve of FIG. 4. Thus, the discharge curve for the battery voltages can be regarded as a linear line and the current power can be calculated proportionally.

Figures 4, 5:
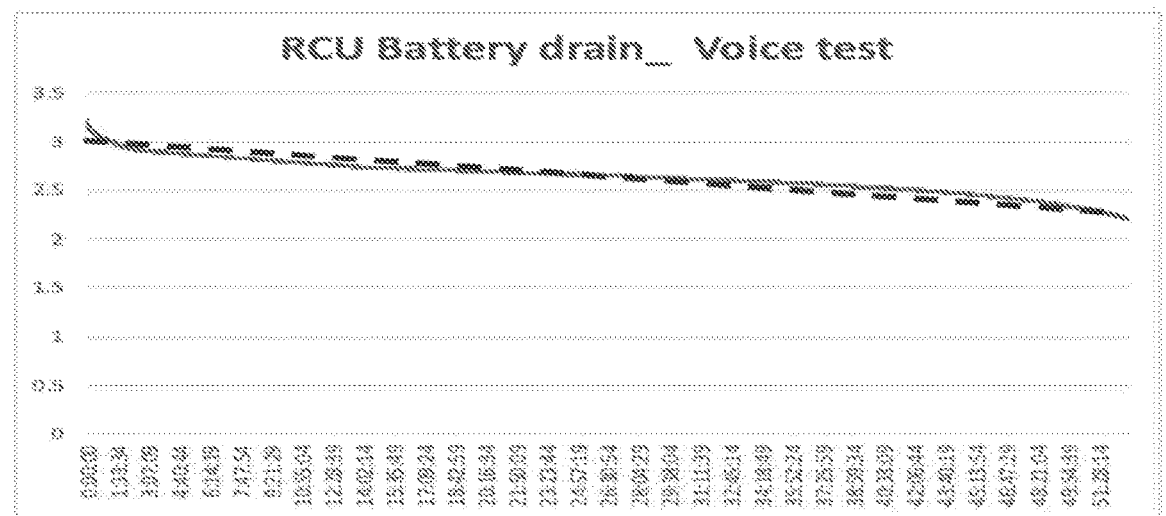
FIG. 4 is a diagram of a discharge curve of the battery voltage during a continuous voice control process of the remote controller according to the present disclosure.
FIG. 5 is a schematic diagram of an embodiment of configurations to a voltage setting of the total power and a cut-off protection voltage of the remote controller of the present disclosure.

The battery of the zinc-carbon battery to be shipped must be over 1.5V. The remote controller needs two zinc-carbon batteries so that the voltage of the battery having 100% power is set as 3V while the cut-off voltage of the battery is defined according to product requirements. In this embodiment, the cut-off voltage is defined as 2.1V as shown in FIG. 5.

The power percentage, Y %, of the battery is calculated using equation (1) as following:

$$Y\% = \frac{X - 2100}{3000 - 2100} \times 100\%,$$

where X represents the current voltage.

In block S17, a reference voltage ($V_f$) updating operation for the battery is performed and it is determined whether the reference voltage ($V_f$) has been updated. If the reference voltage ($V_f$) has not been updated, the reference voltage ($V_f$) updating operation for the battery is repeated. If the reference voltage ($V_f$) has been updated, the process proceeds to the block S16 to repeat the power converting operation.

A remote controller installed with only physical buttons cannot satisfy complex users' requirements and, accordingly, motion sensing controls, voice controls and mouse controls have been applied to the remote controller. However, the control functions of the remote controller consume different powers and brings pressure drop and pressure rise with different degrees of the battery as a control function is activated or terminated. When the pressure drop or the pressure rise is detected, the power displayed in the UI may confuse the user. Additionally, when the voltage of the battery is lower, if a greater pressure drop is detected, the system of the electronic device may mistakenly determine that the voltage of the battery is lower than a protect voltage, which makes the system perform a wrong operation. According to the drawbacks as described, detecting time points of the battery voltage should be optimized to prevent that untrue voltage values for the pressure drop or the pressure rise are recorded, which may called as a modulated voltage detecting method. The remote behaviors may be classified as a no-load state, an instant load state and a heavy load state. The embodiment defines different voltage sampling time for the instant load state and the heavy load state.

Figure 6:
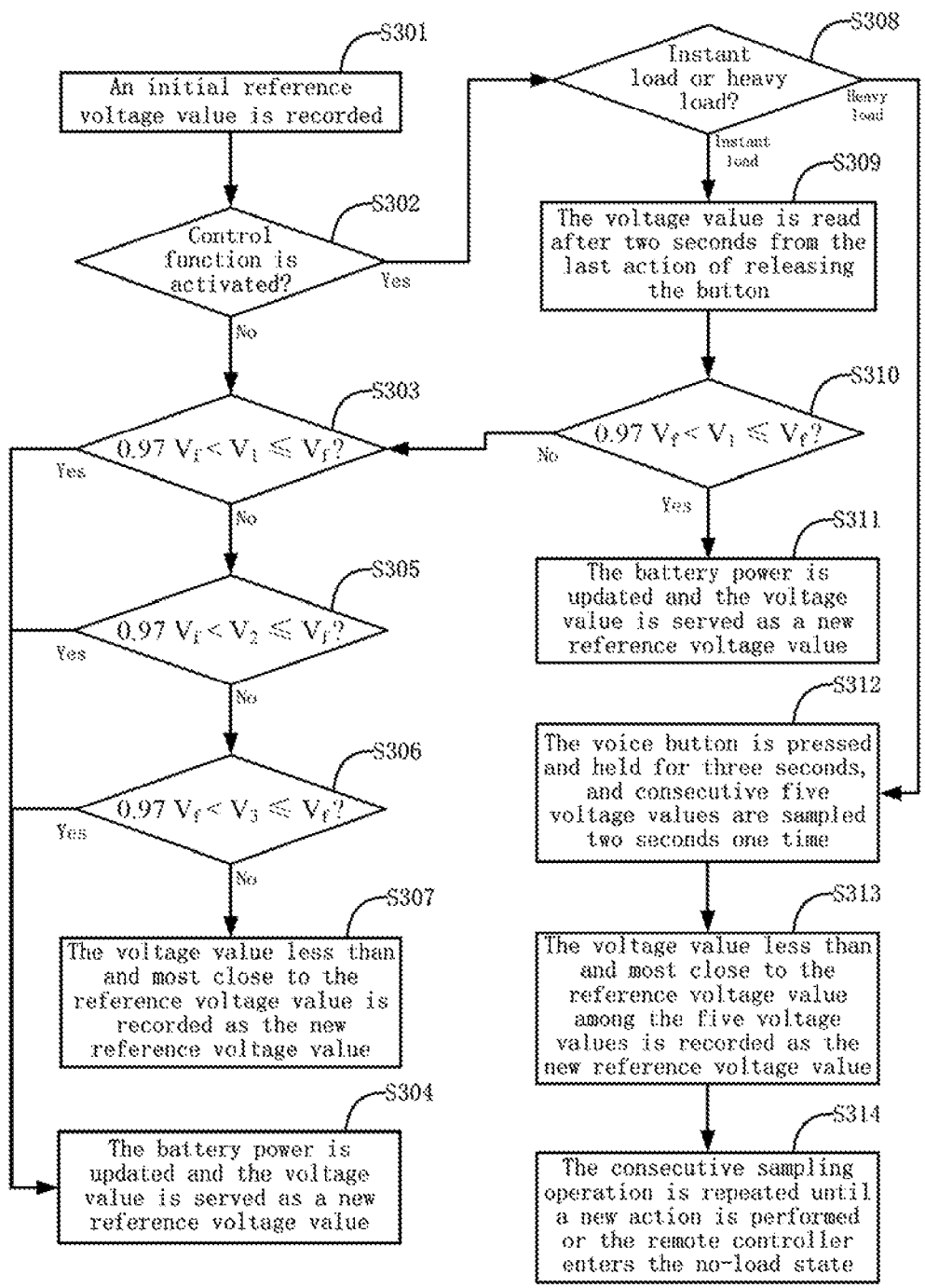
FIG. 6 is a flowchart of a battery reference voltage updating method according to an embodiment of the present disclosure.

FIG. 6 is a flowchart of an embodiment of a battery reference voltage updating method of the present disclosure.

Figure 7:
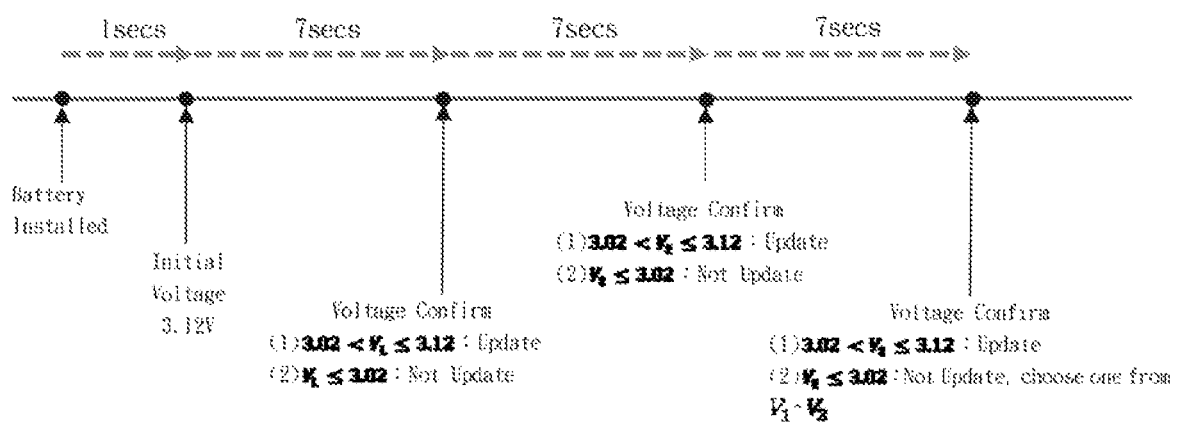
FIG. 7 is a schematic diagram of a modulated voltage detection during the no-load period according to an embodiment of the present disclosure.

In block S301, in this embodiment, a Bluetooth remote controller of a TV box serves as an example, referring to FIG. 7, when a battery is installed into the remote controller for one second passed, the system of the remote controller first records a voltage value and converts the voltage value to a power percentage, and serves the voltage value as an initial reference voltage value ($V_f$) of the battery of the remote controller.

In block S302, it is determined whether one of control functions of the remote controllers is activated.

In block S303, if none of the control functions of the remote controllers is activated, indicating the remote controller works at the no-load state, referring to FIG. 7, the voltage value of the battery is read every 7 seconds. At present, a first voltage value ($V_1$) is read, and it is determined whether the first voltage value is less than or equal to the reference voltage value ($V_f$) and greater than 97% of the reference voltage value ($V_f$) ($0.97V_f<V_1 \leq V_f$?). In this embodiment, the initial reference voltage value ($V_f$) is 3.12V ($3.02<V_1 \leq 3.12$?).

In block S304, if the first voltage value is less than or equal to the reference voltage value ($V_f$) and greater than 97% of the reference voltage value ($V_f$) ($3.02<V_1 \leq 3.12$), the battery power is updated and the first voltage value is served as a new reference voltage value.

In block S305, if the first voltage value is less than or equal to 97% of the reference voltage value ($V_f$) ($V_1 \leq 3.02$) and greater than the reference voltage value ($V_f$) ($V_1>3.12$), the first voltage value is temporarily stored, the voltage value is not updated, and the next voltage value is read. At present, a second voltage value ($V_2$) is read, and it is determined whether the second voltage value is less than or equal to the reference voltage value ($V_f$) and greater than 97% of the reference voltage value ($V_f$) ($0.97V_f<V_2 \leq V_f$?).

If the second voltage value is less than or equal to the reference voltage value ($V_f$) and greater than 97% of the reference voltage value ($V_f$) ($3.02<V_2 \leq 3.12$), the battery power is updated and the second voltage value is served as a new reference voltage value (block S304).

In block S306, if the second voltage value is less than or equal to 97% of the reference voltage value ($V_f$) ($V_2 \leq 3.02$) and greater than the reference voltage value ($V_f$) ($V_2>3.12$), the second voltage value is temporarily stored, the voltage value is not updated, and the next voltage value is read. At present, a third voltage value ($V_3$) is read, and it is determined whether the third voltage value is less than or equal to the reference voltage value ($V_f$) and greater than 97% of the reference voltage value ($V_f$) ($0.97V_f<V_3 \leq V_f$?).

If the third voltage value is less than or equal to the reference voltage value ($V_f$) and greater than 97% of the reference voltage value ($V_f$) ($3.02<V_3 \leq 3.12$), the battery power is updated and the third voltage value is served as a new reference voltage value (block S304).

In block S307, if the third voltage value is less than or equal to 97% of the reference voltage value ($V_f$) ($V_3 \leq 3.02$) and greater than the reference voltage value ($V_f$) ($V_1>3.12$), the third voltage value is temporarily stored and the voltage value is not updated. When each of 3 consecutive voltage values is less than or equal to 97% of the reference voltage value ($V_f$) and greater than the reference voltage value, the voltage value less than and most close to the reference voltage value ($V_f$) is recorded as the new reference voltage value.

In block S308, if one of the control functions of the remote controllers is activated, it is determined whether the remote controller works at the instant load state or the heavy load state.

Figure 8:
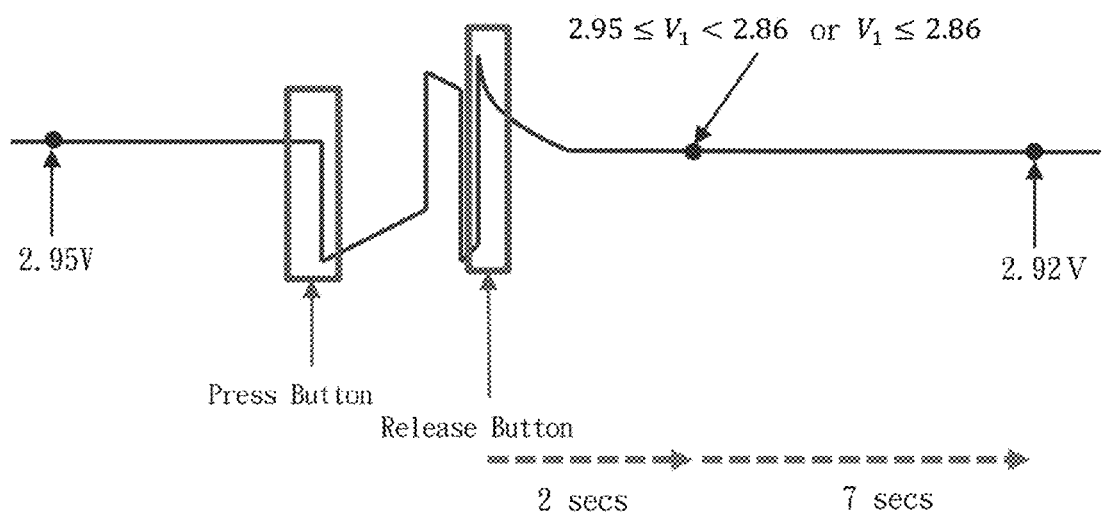
FIG. 8 is a schematic diagram of a modulated voltage detection during the instant period according to an embodiment of the present disclosure.

Referring to FIG. 8, regarding the instant load control, for example, pressing a button of the remote controller, the behavior of pressing a button is composed of two actions comprising pressing down the button and releasing the button. The action of pressing down the button triggers the pressure drop of the battery voltage while the action of releasing the button triggers pressure rise of the battery voltage to recover the battery voltage to a stable state. The actions of pressing down the button and releasing the button are defined as two different digital data under software control.

In block S309, if the remote controller works at the instant load state, the voltage value of the remote controller is read after two seconds from the last action of releasing the button.

In block S310, it is determined whether the voltage value is less than or equal to the reference voltage value ($V_f$) and greater than 97% of the reference voltage value ($V_f$) ($0.97V_f<V_1 \leq V_f$?). In this embodiment, the initial reference voltage value ($V_f$) is 2.95V ($2.86<V_1 \leq 2.95$?).

In block S311, if the voltage value is less than or equal to the reference voltage value ($V_f$) and greater than 97% of the reference voltage value ($V_f$) ($2.86<V_1 \leq 2.95$), the battery power is updated and the voltage value is served as a new reference voltage value. Otherwise, the process proceeds to the block S303 to perform the voltage detection under the no-load state.

Figure 9:
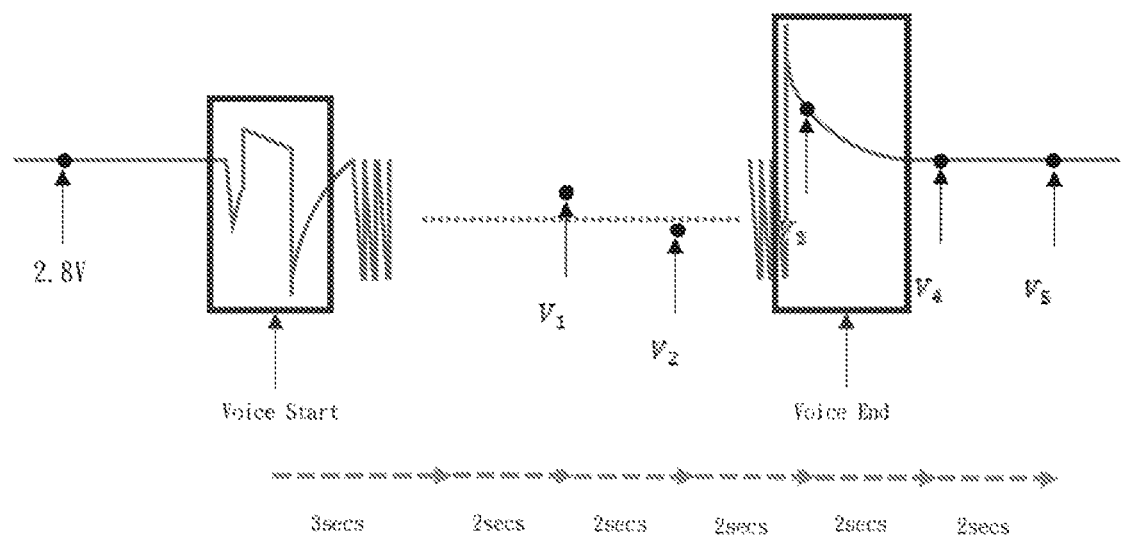
FIG. 9 is a schematic diagram of a modulated voltage detection during the heavy load period according to an embodiment of the present disclosure.

Referring to FIG. 9, regarding the heavy load control, for example, the voice control of the remote controller, when voice signals are detected by the remote controller, the pressure drop of the battery voltage is triggered. When the detection of the voice signals has been terminated, the pressure rise is triggered to recover the battery voltage to the stable state.

In block S312, if the remote controller works at the heavy load state, the voice button is pressed and held for three seconds, and consecutive five voltage values are sampled two seconds one time.

In block S313, the voltage value less than and most close to the reference voltage value ($V_f$) among the five voltage values is recorded as the new reference voltage value.

In block S314, the consecutive sampling operation is repeated until a new action is performed or the remote controller enters the no-load state.

Figure 10:
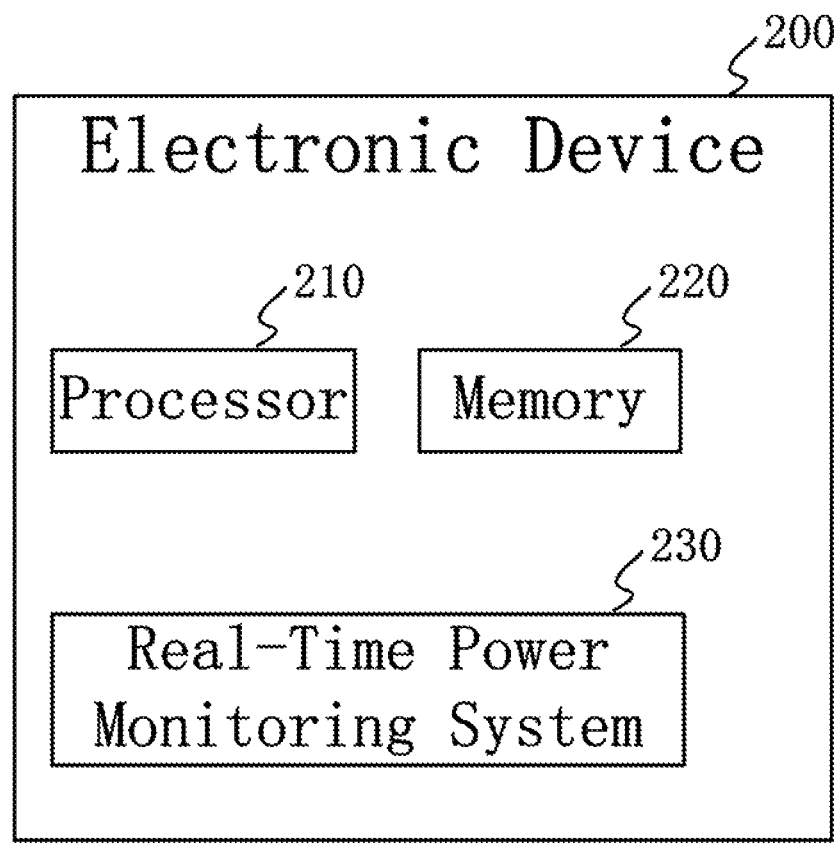
FIG. 10 is a block diagram of an embodiment of the hardware architecture of an electronic device using the method of the present disclosure.

FIG. 10 is a block diagram of an embodiment of the hardware architecture of an electronic device using the real-time power monitoring method of the present disclosure. The electronic device 200 may, but is not limited to, connect to a processor 210, a memory 220, and a real-time power monitoring system 230 via system buses. The electronic device 200 shown in FIG. 10 may include more or fewer components than those illustrated, or may combine certain components.

The memory 220 stores a computer program, such as the real-time power monitoring system 230, which is executable by the processor 210. When the processor 210 executes the real-time power monitoring system 230, the blocks in one embodiment of the real-time power monitoring method applied in the electronic device 200 are implemented, such as blocks S1 to S7 shown in FIG. 1.

It will be understood by those skilled in the art that FIG. 10 is merely an example of the electronic device 200 and does not constitute a limitation to the electronic device 200. The electronic device 200 may include more or fewer components than those illustrated, or may combine certain components. The electronic device 200 may also include input and output devices, network access devices, buses, and the like.

The processor 210 may be a central processing unit (CPU), or other general-purpose processors, a digital signal processor (DSP), an application specific integrated circuit (ASIC), a Field-Programmable Gate Array (FPGA), or another programmable logic device, discrete gate or transistor logic device, discrete hardware components, or the like. The processor 210 may be a microprocessor or other processor known in the art.

The memory 220 can be used to store the real-time power monitoring system 230 and/or modules/units by running or executing computer programs and/or modules/units stored in the memory 220. The memory 220 may include a storage program area and a storage data area. In addition, the memory 220 may include a high-speed random access memory, a non-volatile memory such as a hard disk, a plug-in hard disk, a smart memory card (SMC), and a secure digital (SD) card, flash card, at least one disk storage device, flash device, or other volatile solid state storage device.

The real-time power monitoring system 230 can be partitioned into one or more modules/units that are stored in the memory 220 and executed by the processor 210. The one or more modules/units may be a series of computer program instructions capable of performing particular functions of the real-time power monitoring system 230.

Figure 11:
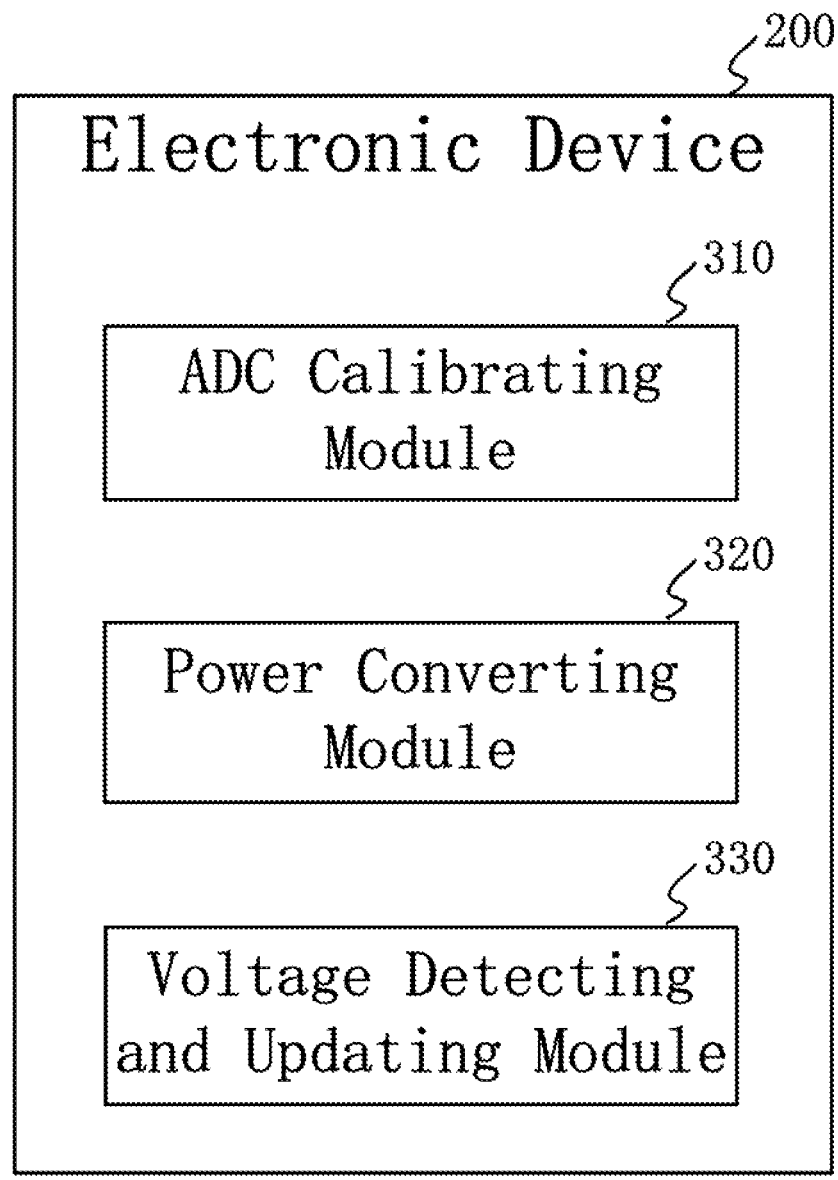
FIG. 11 is a schematic diagram of functional blocks of the electronic device using the method according to an embodiment of the present disclosure.

FIG. 11 is a schematic diagram of an embodiment of functional blocks of the electronic device using the method of the present disclosure.

The electronic device 200 comprises an ADC calibrating module 310, a power converting module 320 and a voltage detecting and updating module 330.

The ADC calibrating module 310 performs an ADC calibration operation to the battery voltage of the electronic device, for example, a remote controller.

Samples of continuous battery variations are usually taken using ADC pins of the MCU of the remote controller. However, resolutions of the MCU and tolerances of circuit components themselves may cause deviations between battery voltages read by the ADC and real battery voltages. Thus, error amplitudes must be confirmed and machines having excessive errors have to be corrected.

The ADC calibrating module 310 provides a stable voltage source to the electronic device, for example, a remote controller, via a power supply and configures two sets of high and low voltages.

The ADC calibrating module 310 records voltage values of the remote controller read by a digital multi-meter (DMM), representing the X axis, and the ADC, representing the Y axis, to form a diagonal line composed of XY coordinates.

Referring to FIG. 3A, the X axis represents the accurate voltage value read by the DMM (VBAT_DMM) while the Y axis represents the voltage value read by the ADC (VBAT_ADC). The VBAT_ADC voltage value is less accurate and should be corrected. Under the optimum state, the VBAT_DMM voltage value is identical to the VBAT_ADC voltage value (y=x). Actually, the VBAT_DMM voltage value is not identical to the VBAT_ADC voltage value (y=ax+b).

The ADC calibrating module 310 performs the ADC calibration operation to calculate a gain and an offset of the diagonal line to generate a coordinate equation of the diagonal line and store the coordinate equation in the MCU. Therefore, the voltage value read by the ADC can be converted to a more accurate real voltage value.

Referring to FIG. 3B, a linear equation in two variables, y=ax+b, of the diagonal line can be obtained according to real voltage values of the diagonal line within the coordinate system, where 'a' indicates the gain and 'b' indicates the offset. The values 'a' and 'b' are substituted into the linear equation in two variables and stored in the MCU to complete the calibration. After that, whenever the voltage values are read by the ADC and substituted into the linear equation in two variables, accurate voltage values of the remote controller can thus be calculated.

Referring to FIG. 3C, upper limits and lower limits of the values 'a' and 'b', "Gain Set" and "Offset Set", can be configured to prevent that remote controllers damaged by process issues are shipped.

The ADC calibrating module 310 determines whether the comparison result between the calculated gain and offset and the optimum gain, for example, 1, and offset, for example, 0, is located with a preset error range. In other words, it is determined whether the calibration of the battery voltage of the remote controller is successful. If the comparison result is located with the preset error range, indicating that the calibration for the battery voltage is successful, the remote controller can be shipped. If the comparison result is located outside the preset error range, indicating the calibration for the battery voltage is unsuccessful, the remote controller is fixed and the process proceeds to the block S11 for repeating the ADC calibration of the remote controller.

When a new battery is installed in the remote controller, the power converting module 320 implements a power converting operation for the battery to the new battery.

An over-the-top (OTT) TV box can display information of a matched remote controller via its user interface (UI). Generally, the displayed battery data is a power percentage not a battery voltage and, therefore, the battery voltage of the new battery must be converted to be displayed by the power percentage. As known by experiments, even the remote controller is successively used by voice controls with the most power consumption, about 10 mA, the battery of the remote controller can be used for more than 53 hours, 2×AAA, 3.3V→2.2V, as shown by the discharge curve of FIG. 4. Thus, the discharge curve for the battery voltages can be regarded as a linear line and the current power can be calculated proportionally.

The battery of the zinc-carbon battery to be shipped must be over 1.5V. The remote controller needs two zinc-carbon batteries so that the voltage of the battery having 100% power is set as 3V while the cut-off voltage of the battery is defined according to product requirements. In this embodiment, the cut-off voltage is defined as 2.1V, as shown in FIG. 5.

The power percentage, Y %, of the battery is calculated using equation (1) as following:

$$Y\% = \frac{X - 2100}{3000 - 2100} \times 100\%,$$

where X represents the current voltage.

The voltage detecting and updating module 330 performs a reference voltage ($V_f$) updating operation for the battery and determines whether the reference voltage ($V_f$) has been updated. If the reference voltage ($V_f$) has not been updated, the reference voltage ($V_f$) updating operation for the battery is repeated. If the reference voltage ($V_f$) has been updated, the power converting operation is repeated.

The reference voltage ($V_f$) updating operation further comprises the following processing steps.

In this embodiment, a Bluetooth remote controller of a TV box serves as an example, referring to FIG. 7, when a battery is installed into the remote controller for one second passed, the system of the remote controller first records a voltage value and converts the voltage value to a power percentage, and serves the voltage value as an initial reference voltage value ($V_f$) of the battery of the remote controller.

It is determined whether one of control functions of the remote controllers are activated.

If none of the control functions of the remote controllers is activated, indicating the remote controller works at the no-load state, referring to FIG. 7, the voltage value of the battery is read every 7 seconds. At present, a first voltage value ($V_1$) is read, and it is determined whether the first voltage value is less than or equal to the reference voltage value ($V_f$) and greater than 97% of the reference voltage value ($V_f$) ($0.97V_f<V_1 \leq V_f$?). In this embodiment, the initial reference voltage value ($V_f$) is 3.12V ($3.02<V_1 \leq 3.12$?).

If the first voltage value is less than or equal to the reference voltage value ($V_f$) and greater than 97% of the reference voltage value ($V_f$) ($3.02<V_1 \leq 3.12$), the battery power is updated and the first voltage value is served as a new reference voltage value.

If the first voltage value is less than or equal to 97% of the reference voltage value ($V_f$) ($V_1 \leq 3.02$) and greater than the reference voltage value ($V_f$) ($V_1>3.12$), the first voltage value is temporarily stored, the voltage value is not updated, and the next voltage value is read. At present, a second voltage value ($V_2$) is read, and it is determined whether the second voltage value is less than or equal to the reference voltage value ($V_f$) and greater than 97% of the reference voltage value ($V_f$) ($0.97V_f<V_2 \leq V_f$?).

If the second voltage value is less than or equal to the reference voltage value ($V_f$) and greater than 97% of the reference voltage value ($V_f$) ($3.02<V_2 \leq 3.12$), the battery power is updated and the second voltage value is served as a new reference voltage value.

If the second voltage value is less than or equal to 97% of the reference voltage value ($V_f$) ($V_2 \leq 3.02$) and greater than the reference voltage value ($V_f$) ($V_2>3.12$), the second voltage value is temporarily stored, the voltage value is not updated, and the next voltage value is read. At present, a third voltage value ($V_3$) is read, and it is determined whether the third voltage value is less than or equal to the reference voltage value ($V_f$) and greater than 97% of the reference voltage value ($V_f$) ($0.97V_f<V_3 \leq V_f$?).

If the third voltage value is less than or equal to the reference voltage value ($V_f$) and greater than 97% of the reference voltage value ($V_f$) ($3.02<V_3 \leq 3.12$), the battery power is updated and the third voltage value is served as a new reference voltage value.

If the third voltage value is less than or equal to 97% of the reference voltage value ($V_f$) ($V_3 \leq 3.02$) and greater than the reference voltage value ($V_f$) ($V_1>3.12$), the third voltage value is temporarily stored and the voltage value is not updated.

When each of 3 consecutive voltage values is less than or equal to 97% of the reference voltage value ($V_f$) and greater than the reference voltage value, the voltage value less than and most close to the reference voltage value ($V_f$) is recorded as the new reference voltage value.

If one of the control functions of the remote controllers is activated, it is determined whether the remote controller works at the instant load state or the heavy load state.

Referring to FIG. 8, regarding the instant load control, for example, pressing a button of the remote controller, the behavior of pressing a button is composed of two actions comprising pressing down the button and releasing the button. The action of pressing down the button triggers the pressure drop of the battery voltage while the action of releasing the button triggers pressure rise of the battery voltage to recover the battery voltage to a stable state. The actions of pressing down the button and releasing the button are defined as two different digital data under software control.

If the remote controller works at the instant load state, the voltage value of the remote controller is read after two seconds from the last action of releasing the button.

It is determined whether the voltage value is less than or equal to the reference voltage value ($V_f$) and greater than 97% of the reference voltage value ($V_f$) ($0.97V_f<V_1 \leq V_f$?). In this embodiment, the initial reference voltage value ($V_f$) is 2.95V ($2.86<V_1 \leq 2.95$?).

If the voltage value is less than or equal to the reference voltage value ($V_f$) and greater than 97% of the reference voltage value ($V_f$) ($2.86<V_1 \leq 2.95$), the battery power is updated and the voltage value is served as a new reference voltage value. Otherwise, the process proceeds to the block S303 to perform the voltage detection under the no-load state.

Referring to FIG. 9, regarding the heavy load control, for example, the voice control of the remote controller, when voice signals are detected by the remote controller, the pressure drop of the battery voltage is triggered. When the detection of the voice signals has been terminated, the pressure rise is triggered to recover the battery voltage to the stable state.

If the remote controller works at the heavy load state, the voice button is pressed and held for three seconds, and consecutive five voltage values are sampled two seconds one time.

The voltage value less than and most close to the reference voltage value ($V_f$) among the five voltage values is recorded as the new reference voltage value.

The consecutive sampling operation is repeated until a new action is performed or the remote controller enters the no-load state.

It is to be understood, however, that even though numerous characteristics and advantages of the present disclosure have been set forth in the foregoing description, together with details of the structure and function of the present disclosure, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A real-time power monitoring method executable by an electronic device, comprising:
    performing an analog-to-digital converter (ADC) calibration operation to a voltage of a first battery of the electronic device;
    calculating and forming a diagonal line for the first battery; and
    determining whether a comparison result between a gain and an offset and an optimum gain and an optimum offset is located with a preset error range, wherein
    if the comparison result is located with the preset error range, determining that the voltage calibration for the first battery is successful; and
    if the comparison result is located outside the preset error range, determining that the voltage calibration for the first battery is unsuccessful, analyzing and fixing the first battery and for re-performing the ADC calibration to the first battery.

2. The method of claim 1, wherein the ADC calibration operation further comprises:

providing a stable voltage source to the electronic device using a power supply and configuring two sets of high and low voltages;

recording voltage values of the electronic device read by a digital multi-meter (DMM), representing the X axis, and an ADC, representing the Y axis, to form a diagonal line composed of XY coordinates; and performing the ADC calibration operation to calculate the gain and the offset of the diagonal line to generate a coordinate equation of the diagonal line.

3. The method of claim 1, further comprising:

performing a reference voltage updating operation to a second battery of the electronic device;

determining whether a reference voltage of the second battery has been updated;

re-performing the reference voltage updating operation to the second battery if the reference voltage of the second battery has not been updated; and performing a power converting operation to the second battery.

4. The method of claim 3, wherein the power converting operation further comprises:

recording a voltage value of the second battery and serving the voltage value as an initial reference voltage value of the second battery;

determining whether one of control functions of the electronic device is activated;

if none of the control functions of the electronic device is activated, determining that the electronic device works at a no-load state, and reading the voltage value of the battery every pre-defined time to obtain a first voltage value;

determining whether the first voltage value is less than or equal to the initial reference voltage value and greater than X % of the initial reference voltage value, where X is greater than 0;

if the first voltage value is less than or equal to the initial reference voltage value and greater than X % of the initial reference voltage value, updating the power of the second battery and serving the first voltage value as a second reference voltage value;

if the first voltage value is less than or equal to the X % of initial reference voltage value and greater than the initial reference voltage value, temporarily storing the first voltage value and not updating the voltage value of the second battery;

obtaining a second voltage value of the second battery;

determining whether the second voltage value is less than or equal to the initial reference voltage value and greater than X % of the initial reference voltage value;

if the second voltage value is less than or equal to the initial reference voltage value and greater than X % of the initial reference voltage value, updating the power of the second battery and serving the second voltage value as a third reference voltage value;

if the second voltage value is less than or equal to the X % of initial reference voltage value and greater than the initial reference voltage value, temporarily storing the second voltage value and not updating the voltage value of the second battery;

obtaining a third voltage value of the second battery;

determining whether the third voltage value is less than or equal to the initial reference voltage value and greater than X % of the initial reference voltage value;

if the third voltage value is less than or equal to the initial reference voltage value and greater than X % of the initial reference voltage value, updating the power of the second battery and serving the third voltage value as a fourth reference voltage value;

if the third voltage value is less than or equal to the X % of initial reference voltage value and greater than the initial reference voltage value, temporarily storing the third voltage value and not updating the voltage value of the second battery; and recording one of the first, second and third voltage values less than and most close to the initial reference voltage value as a new reference voltage value.

5. The method of claim 4, further comprising:

if one of the control functions of the electronic device is activated, determining whether the electronic device works at an instant load state or a heavy load state;

if the electronic device works at the instant load state, reading the voltage value of the second battery after a first preset time from the last action of releasing a button of the electronic device;

determining whether the voltage value of the second battery is less than or equal to the initial reference voltage value and greater than X % of the initial reference voltage value;

if the voltage value of the second battery is less than or equal to the initial reference voltage value and greater than X % of the initial reference voltage value, updating the power of the second battery and serving the voltage value of the second battery as a new reference voltage value; and if the voltage value of the second battery is less than or equal to X % of the initial reference voltage value and greater than the initial reference voltage value, performing voltage detection under the no-load state.

6. The method of claim 5, further comprising:

if the electronic device works at the heavy load state, pressed and held the voice button for a second preset time and sampling consecutive five voltage values by every second time interval; and recording the voltage value less than and most close to the initial reference voltage value among the five voltage values as the new reference voltage value.

7. The method of claim 6, further comprising:

performing the power converting operation to the second battery using an equation represented as following:

$$Y\% = \frac{X-N}{M-N} \times 100\%,$$

where Y indicates the power of the second battery, X indicates the current voltage of the second battery, M indicates the voltage of the second battery with full power, and N indicates a cut-off protection voltage of the second battery.

8. An electronic device, comprising:

an analog-to-digital converter (ADC) calibration module, configured to perform an ADC calibration operation to a voltage of a first battery of the electronic device, calculate and form a diagonal line for the first battery, determine whether a comparison result between a gain and an offset and an optimum gain and an optimum offset is located with a preset error range, if the comparison result is located with the preset error range, determine that the voltage calibration for the first battery is successful, and, if the comparison result is located outside the preset error range, determine that the voltage calibration for the first battery is unsuccessful, analyzing and fixing the first battery and for re-performing the ADC calibration to the first battery;

a power converting module, configured to implement a power converting operation for the battery to a second battery; and a voltage detecting and updating module, configured to implement a reference voltage updating operation to the second battery.

9. The device of claim 8, wherein the ADC calibration module is further configured to record a voltage value of the second battery and serve the voltage value as an initial reference voltage value of the second battery, determine whether one of control functions of the electronic device is activated, if none of the control functions of the electronic device is activated, determine that the electronic device works at a no-load state, and read the voltage value of the battery every first preset time to obtain a first voltage value, determine whether the first voltage value is less than or equal to the initial reference voltage value and greater than X % of the initial reference voltage value, where X is greater than 0, if the first voltage value is less than or equal to the initial reference voltage value and greater than X % of the initial reference voltage value, update the power of the second battery and serve the first voltage value as a second reference voltage value, if the first voltage value is less than or equal to the X % of initial reference voltage value and greater than the initial reference voltage value, temporarily store the first voltage value and not update the voltage value of the second battery, obtain a second voltage value of the second battery, determine whether the second voltage value is less than or equal to the initial reference voltage value and greater than X % of the initial reference voltage value, if the second voltage value is less than or equal to the initial reference voltage value and greater than X % of the initial reference voltage value, update the power of the second battery and serve the second voltage value as a third reference voltage value, if the second voltage value is less than or equal to the X % of initial reference voltage value and greater than the initial reference voltage value, temporarily store the second voltage value and not update the voltage value of the second battery, obtain a third voltage value of the second battery, determine whether the third voltage value is less than or equal to the initial reference voltage value and greater than X % of the initial reference voltage value, if the third voltage value is less than or equal to the initial reference voltage value and greater than X % of the initial reference voltage value, update the power of the second battery and serve the third voltage value as a fourth reference voltage value, if the third voltage value is less than or equal to the X % of initial reference voltage value and greater than the initial reference voltage value, temporarily store the third voltage value and not update the voltage value of the second battery, and record one of the first, second and third voltage values less than and most close to the initial reference voltage value as a new reference voltage value.

10. A computer program product for execution on a system operatively connected with a block chain distributed network, the computer program product for using the block chain distributed network for mapping aliases, the computer program product comprising at least one non-transitory computer-readable medium having computer-readable program code portions embodied therein, the computer-readable program code portions comprising:

an executable portion configured to performing an analog-to-digital converter (ADC) calibration operation to a voltage of a first battery of the electronic device;

an executable portion configured to calculate and form a diagonal line for the first battery;

an executable portion configured to determine whether a comparison result between a gain and an offset and an optimum gain and an optimum offset is located with a preset error range;

an executable portion configured to, if the comparison result is located with the preset error range, determine that the voltage calibration for the first battery is successful; and an executable portion configured to, if the comparison result is located outside the preset error range, determine that the voltage calibration for the first battery is unsuccessful, analyzing and fixing the first battery and for re-performing the ADC calibration to the first battery.

* * * * *